(12) United States Patent
Rutkowski et al.

(10) Patent No.: US 9,524,358 B1
(45) Date of Patent: Dec. 20, 2016

(54) CORE-MODULAR INTEROPERABILITY ARCHITECTURE FOR MODELING AND SIMULATION

(71) Applicants: Krzysztof J. Rutkowski, Riva, MD (US); Stephen M. Farley, Sterling, VA (US)

(72) Inventors: Krzysztof J. Rutkowski, Riva, MD (US); Stephen M. Farley, Sterling, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 717 days.

(21) Appl. No.: 13/913,929

(22) Filed: Jun. 10, 2013

(51) Int. Cl.
 *G06G 7/48* (2006.01)
 *G06F 17/50* (2006.01)

(52) U.S. Cl.
 CPC ................ *G06F 17/5009* (2013.01)

(58) Field of Classification Search
 CPC ............. G06F 17/5009; G06F 17/50
 USPC ........................................... 703/6
 See application file for complete search history.

(56) References Cited

U.S. PATENT DOCUMENTS

| | | | |
|---|---|---|---|
| 7,512,526 B2 | 3/2009 | Allen et al. | |
| 7,657,406 B2 | 2/2010 | Tolone et al. | |
| 8,195,436 B2 | 6/2012 | Tolone et al. | |
| 2004/0007121 A1* | 1/2004 | Graves | G01C 21/20 89/1.11 |
| 2009/0228253 A1 | 9/2009 | Tolone et al. | |
| 2010/0217573 A1 | 8/2010 | Hatcherson et al. | |
| 2011/0309143 A1 | 12/2011 | Wood et al. | |
| 2012/0088209 A1* | 4/2012 | Poole | G09B 9/003 434/11 |

OTHER PUBLICATIONS

Choi, Sang Yeong et al., "The DADSim Air Defense Simulation Environment", Nov. 15-17, 2000, The 5th IEEE High Assurance Systems Engineerign Symposium, IEEE.*

(Continued)

*Primary Examiner* — Cedric D Johnson
(74) *Attorney, Agent, or Firm* — Howard Kaiser (57) ABSTRACT

Exemplary inventive practice provides initially for designation of all tasks contemplated for performance in the context of an interoperability architecture for computer modeling/simulation. Task requirements afford the bases for determining the models to be incorporated and the functionalities to be carried out in the architecture. The major architectural elements are the core, the interface, and the modules. The core is compartmentalized. Each module constitutes an individual model. Each functionality is allocated to either the core or at least one module, with the guiding principle that a functionality that characterizes the modules in general should be situated in the core, in at least one category. The interface provides for plug-and-play functionality of the modules. The architecture operates in an iterative three-phase cycle: modules write data to the core; the core processes data; modules read updated core data. The invention reduces model development, increases code reuse, and promotes interoperability of diverse models.

12 Claims, 8 Drawing Sheets

(56) References Cited

OTHER PUBLICATIONS

Dahmann, Judith S. et al., "Standards for Simulation: As Simple as Possible but not Simpler the High Level Architecture for Simulation", 1998, Simulation, vol. 71, No. 6, Simulation Concils, Inc.*

Topcu, Okan et al., "Developing an HLA-Based Naval Maneuvering Simulation", 2005, Naval Engineers Journal.*

Zhao, Gang et al., "CLOVER: An Agent-Based Approach to Systems Interoperability in Cooperative Design Systems", 2001, Computers in Industry 45, Elsevier Science B.V.*

Hernandez, Mark et al, "MH-60 Seahawk/MQ-8 Fire Scout Interoperability", Sep. 27, 2010, Thesis and Dissertations, Calhoun: The NPS Institutional Archive.*

Judith S. Dahmann, Richard M. Fujimoto and Richard M. Weatherly, "The Department of Defense High Level Architecture," Proceedings of the 1997 Winter Simulation Conference, Atlanta, Georgia, Dec. 7-10, 1997.

Judith S. Dahmann, Richard M. Fujimoto and Richard M. Weatherly, "The DoD High Level Architecture: An Update," Proceedings of the Second International Workshop on Distributed Interactive Simulation and Real-Time Applications, Montreal, Canada, Jul. 19-20, 1998.

Richard M. Fujimoto and Richard M. Weatherly, "Time Management in the DoD High Level Architecture," PADS '96 Proceedings of the Tenth Workshop on Parallel and Distributed Simulation, ACM SIGSIM Simulation Digest, vol. 26, Issue 1, Jul. 1996, pp. 60-67.

Bjorn Moller, Steve Eriksson and Asa Wihlborg, "Developing an HLA Tutorial: Philosophy and Best Practices," Proceedings of 2012 Fall Simulation Interoperability Workshop, 12F-SIW-047, Simulation Interoperability Standards Organization, Sep. 2012.

Jae-Hyun Kim and Tag Gon Kim, "Proposal of High Level Architecture Extension," Artificial Intelligence and Simulation, Lecture Notes in Computer Science, vol. 3397, 2005, pp. 128-137.

* cited by examiner

Use Case Name: Fuel Management               Version: x.x

Goal: To model fuel management.

Summary: Monitor and forecast fuel requirements; manage and distribute petroleum products based on forecasted unit requirements and availability. Schedule and conduct fueling and replenishment of naval/amphibious/ land forces to ensure provision of continued support to forces operating at sea and ashore. Includes UNREP from sea and shore-based assets in addition to replenishment of the forces operating ashore from sea- and shore-based assets. Also includes amphibious assault bulk fuel system (AABFS), offshore petroleum distribution system (OPDS), and bulk offload of fuel to barrels or bladders from shipping.

Actors: From platform/unit commanders to task force commanders.

Stakeholders: Logisticians, Tacticians, Numbered fleets, COCOMs

Preconditions:   1) Inventories are kept for fuel for each platform/unit.
                     2) Priorities for allocation of fuel stocks are available to commanders.

Postconditions:  1) A plan for the projection and allocation of fuel is generated.

Notes: NTA 4.2.1, NTA 4.2.1.1, M1 Percent Of daily Class III provided by host nation; M2 Gallons Lost to enemy action; M3 Gallons Per Day Of required fuel delivered to theater.

Author and Date: Kris Rutkowski, xx/xx/20xx

FIG. 5

- Logistics Commander
  - Fueling Priorities
  - Fuel Types
    - Fuel Inventories
    - Fuel Capacities
    - Fuel Movement Requirements
- Fuel Usage Forecasts
- Fuel Requests/Status
- Platforms Fueling Other Platforms
- Communication Networks
- Fueling Readiness
- Maintenance/Availability
- Situational Awareness
- Track Cost

CORE-MODULAR INTEROPERABILITY ARCHITECTURE FOR MODELING AND SIMULATION

BACKGROUND OF THE INVENTION

The present invention relates to computer models and simulations, more particularly to computer architectures for creating and facilitating interoperability among various systems and components that are to be included in the modeling or simulation of activities such as involving mission performance.

The "High Level Architecture" is a computer simulation architecture that is designed to establish and facilitate interoperability among different classes of computer simulations. The HLA has been developed by the United States Department of Defense (DoD) since the early 1990s.

According to the HLA, the simulations interact as managed by a run-time infrastructure (RTI), which uses an object model template (OMT) as the common framework for communication between the simulation entities. Each simulation entity is known as a federate. The combination of plural federates that are connected via the RTI is referred to as the federation. The OMT consists of two models for describing interactions and characteristics. The federation object model (FOM) describes interactions and characteristics for the federation; the simulation object model (SOM) describes interactions and characteristics for a particular federate.

The following two papers, each of which is hereby incorporated herein by reference, are informative regarding the DoD's HLA: Judith S. Dahmann, Richard M. Fujimoto and Richard M. Weatherly, "The Department of Defense High Level Architecture," Proceedings of the 1997 Winter Simulation Conference, Atlanta, Ga., 7-10 Dec. 1997; Judith S. Dahmann, Richard M. Fujimoto and Richard M. Weatherly, "The DoD High Level Architecture: An Update," Proceedings of the Second International Workshop on Distributed Interactive Simulation and Real-Time Applications, Montreal, Canada, 19-20 Jul. 1998.

"Interoperability" is the watchword, in general, for HLA. In 1996 the United States Department of Defense (DoD) designated the High Level Architecture (HLA) as the technical architecture for all DoD simulations. The HLA was intended to serve as an interoperative architecture for distributed computer simulation systems across all classes of simulations in the DoD. In its provisions on policies regarding DoD modeling and simulation (M&S) management, DoD Directive 5000.59, 8 Aug. 2007 states the goal of "maximizing commonality, reuse, interoperability, efficiencies and effectiveness of M&S."

Nevertheless, universal interoperability among all simulations, regardless of disparities, is easier said than done. Dahmann et al., in the aforementioned paper entitled "The DoD High Level Architecture: An Update," opine that universal interoperability of simulations cannot be accomplished under current technology: "Universal interoperability (the ability of any simulation to interoperate with any other simulation, regardless of original purpose or technical implementation) is not feasible with today's technology."

The DoD's Modeling and Simulation Coordination Office (M&SCO), formerly called the Defense Modeling and Simulation Office (DMSO), acknowledges on its Internet home page that the original M&S vision is not as far along as it should be—that is, the vision of "a viable, flexible common technical framework for M&S to facilitate interoperability and reuse so DoD users could quickly find and pull together models and simulations to create credible combinations of live, virtual, and constructive joint capability forces for acquisition decision-making, programmatic analysis, experimentation, operational planning, testing, training, mission rehearsal, doctrine development, etc."

Various workarounds have been suggested for HLA, For instance, subject matter-specific standards on top of HLA, extensions to HLA, and "best practices" to facilitate federation reuse. However, HLA workarounds, to the extent that they have been implemented, have met with limited success.

In the past, many DoD models and simulations were implemented for supporting specific military decisions relating to capacity, capability, and concepts of operation (CONOPS). These models usually demanded development of requirements and specifications, data input, analyst interface, and performance data for every entity that was to be modeled. Typically, at least two years were needed to develop a mission-level model and validate its performance before analysis could begin.

Although the terms "model" and "simulation" have occasionally been distinguished from each other in technical usage, these terms are used interchangeably herein to broadly refer to representation of a thing or system of things, such as representation of characteristics and behaviors of military missions.

SUMMARY OF THE INVENTION

In view of the foregoing, an object of the present invention is to provide better interoperability architecture for modeling and simulation (M&S).

The present invention can be embodied as a method, an apparatus, a computer-readable medium, etc. In accordance with exemplary embodiments of the present invention, tasks are established, use cases are formulated that correspond to the tasks, and requirements are identified based on the use cases. Based on the requirements, an interoperability architecture is constructed so as to be characterized by a core, an interface, and plural modules. Each module represents a different computer model.

The constructing of the interoperability architecture includes determining the modules, determining functionalities, and assigning each functionality to either the core or each of at least one module. The core has four core components. Necessary usage of a functionality by all of the modules implies assignment of the functionality to the core. Necessary usage of a functionality by fewer than all of the modules implies assignment of the functionality to the module or modules that necessitate the functionality.

A computer is implemented for continually and iteratively operating a cyclical process having at least three phases. Importation of data from the modules to the core, via the interface, can take place during the first phase. Processing by the core in accordance with the importation of data can take place during the second phase. Exportation of data from the core to the modules, via said interface, can take place during the third phase. Neither the importation nor the exportation can take place during the second phase.

Previous interoperability architectures (e.g., the HLA) were developed to address Navy M&S interoperability, but afforded limited interoperability. For instance, the interoperability of the HLA is inherently self-limiting because the run-time infrastructure (RTI) is geared toward managing interactions of particular federates. Generally speaking, the HLA lacks versatility, albeit a particular embodiment of an HLA can be effective for a given application.

The present invention was conceived as part of a Navy effort to improve Navy M&S interoperability. The present inventors sought to create an interoperability architecture that would provide for interoperability for all Navy mission modeling. They took into consideration activities listed in the Navy's Universal Navy Task List (UNTLs), as well as current Navy approaches to incorporating test cases into a mission modeling architecture.

The M&S interoperability architecture of the present invention features unique and superior interoperability, and is practical and efficient in its implementation. Exemplary embodiments of the present invention are interoperability architectures for Navy mission-level M&S. The present inventors have coined the name "SimCore" to describe their M&S interoperability architecture. The three basic components of the SimCore architecture are the Core, the Modules, and the Interface.

Exemplary practice of SimCore is directed to Navy missions. For example, the present invention provides a composition-based core-modular architecture for the simulation of military operations. SimCore can reduce model development time and cost, and can provide for combining of war-fighting modules (undersea, surface, air, and space) with logistics and manpower modules, in a plug-and-play fashion. The present invention performs the functions common to all of these activities, and manages the simulation time steps and model space. These inventive capabilities will expand the usefulness of mission modeling, and will also allow operations analysis to use the model to support Navy decision points with less lead time.

SimCore can facilitate module development and validation, decrease costs, simplify modernization of legacy codes, support multiple modules simultaneously, and improve code performance. SimCore can promote rapid development of modules to support emerging analytical agendas (perhaps a matter of months versus years). Potential near-term Navy mission areas for inventive M&S include Integrated Air and Missile Defense (IAMD), Military Deception (MILDEC), Readiness to Warfighting, Special Warfare, Medical Support, and Expeditionary Warfare. SimCore is an extensible architecture that fosters modeling/simulation agility.

A SimCore interface can serve as interface for data shared among the modules, ensure and verify standard compliance for modules, provide for mixing and matching of modules from third-party sources, and aid in configuration management of modules. A SimCore architecture can be embellished, expanded, or enhanced, in accordance with inventive principles, by accounting for decisions made by groups of individuals. Depending on the inventive embodiment, it may be advantageous to "pipeline" the model information to permit parallel processing, thereby optimizing the performance of the system constituted by the CPU and graphics processor. The present invention's interoperability architecture can be used in a net-centric environment with modules operated from remote sites. A SimCore architecture represents the arbiter of shared resources.

BRIEF DESCRIPTION OF THE DRAWINGS

The present invention will now be described, by way of example, with reference to the accompanying drawings, wherein:

FIG. 5 depicts a Fuel Management use case.

DESCRIPTION OF EXEMPLARY
EMBODIMENTS OF THE INVENTION

Figure 1:
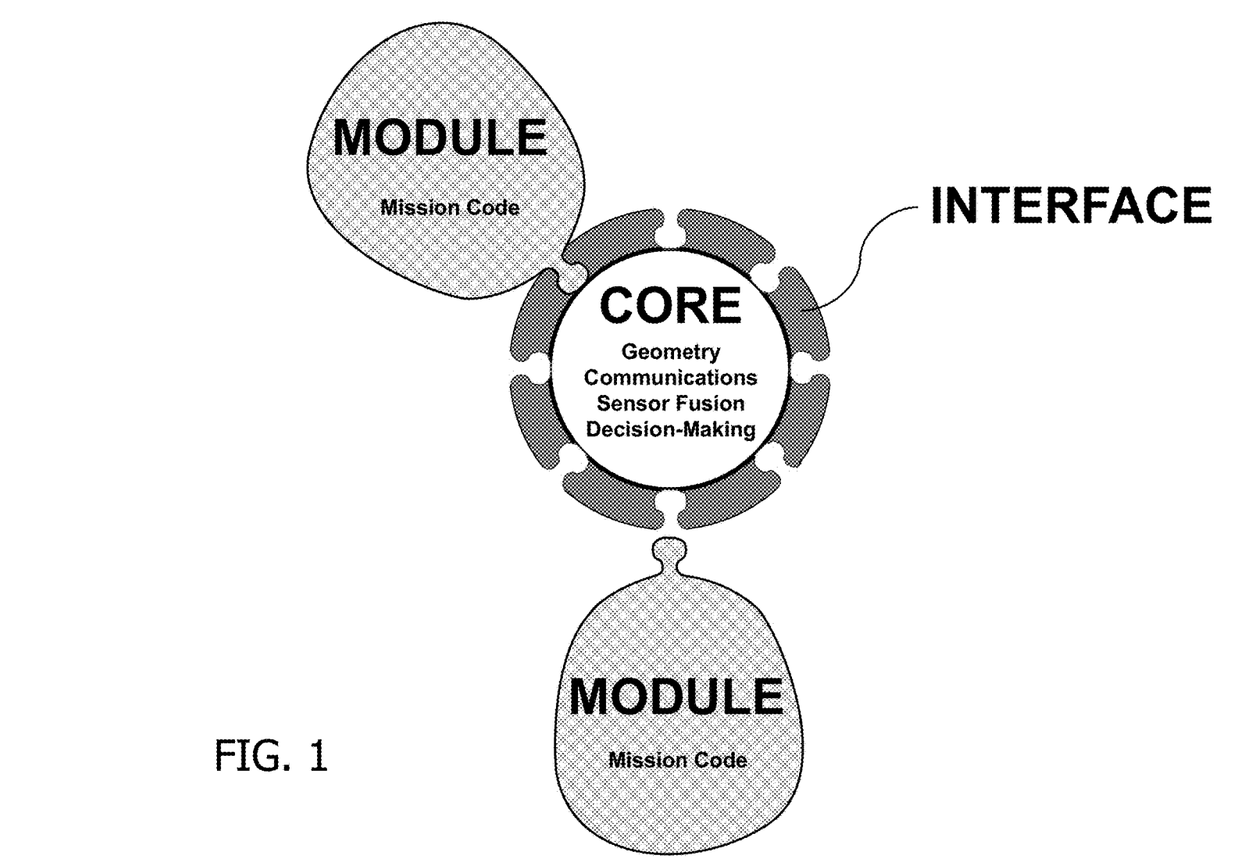
FIG. 1 is a diagram illustrating the three main components of SimCore architecture in accordance with exemplary practice of the present invention, namely, (i) the core, (ii) the interface, and (iii) the modules.
Figure 2:
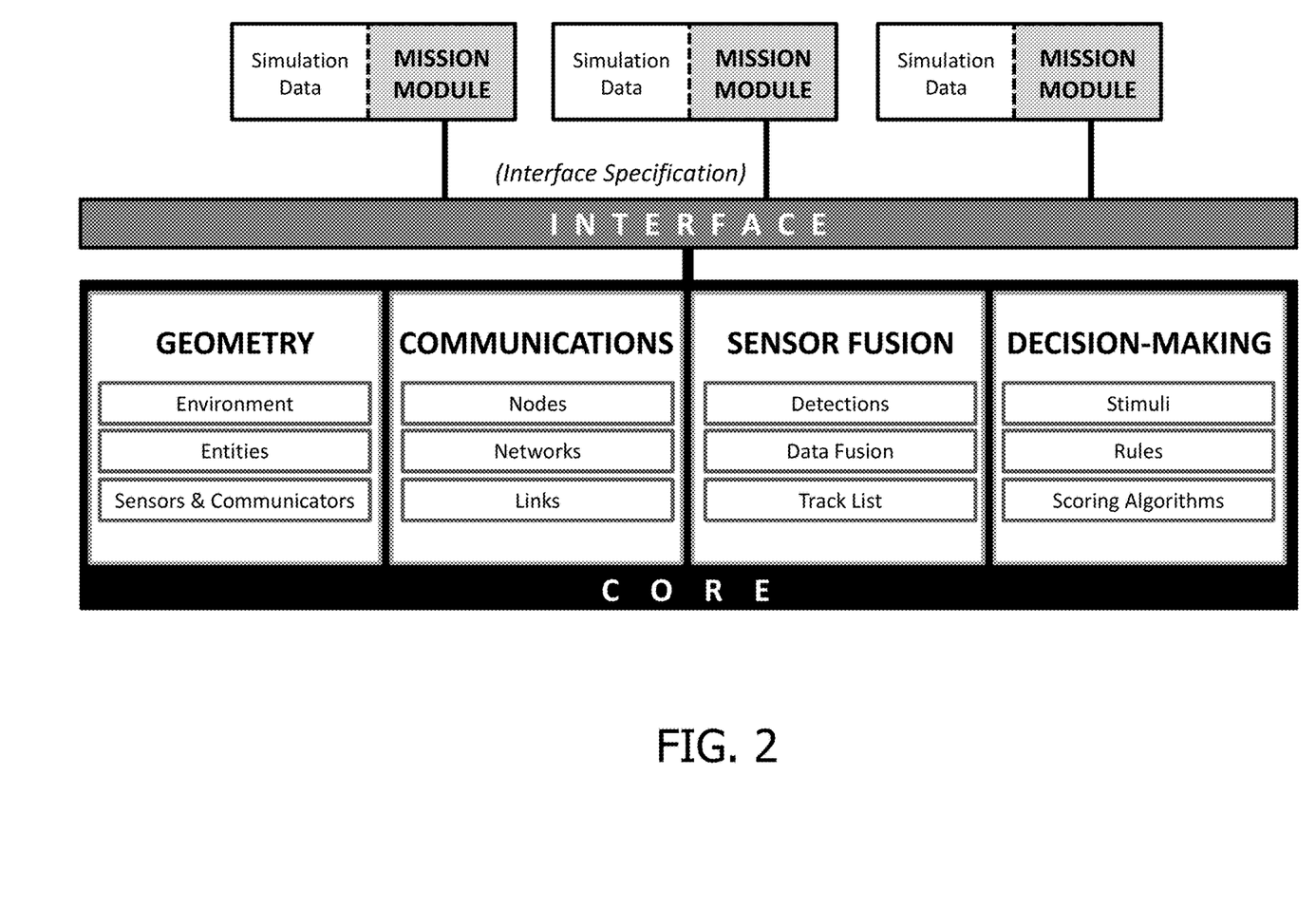
FIG. 2 is a diagram illustrating, in greater detail, SimCore architecture in accordance with exemplary practice of the present invention.
Figure 3:
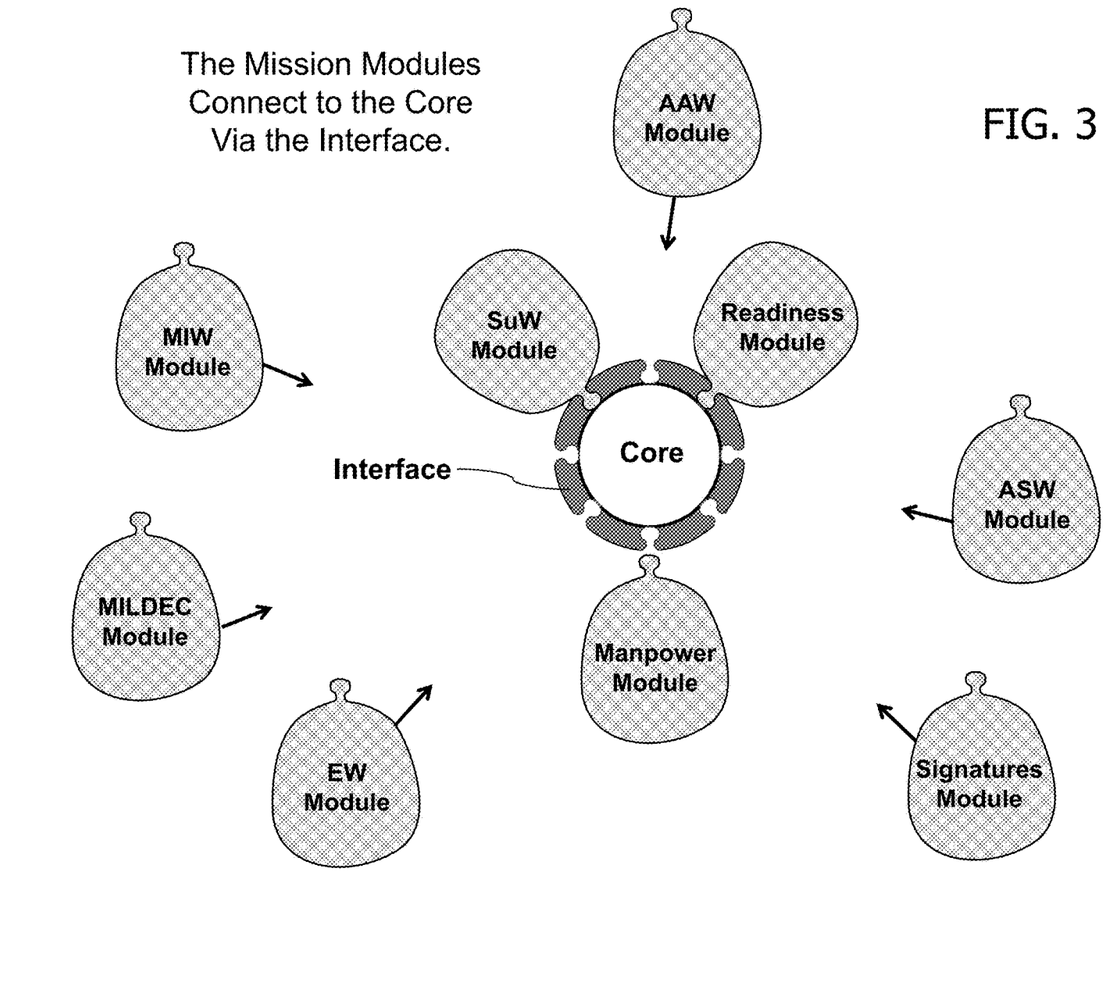
FIG. 3 is a diagram, similar to FIG. 1, showing examples of various modules that may be suitable for inclusion in Navy mission applications of inventive practice.

Referring now to FIGS. 1 through 3, the fundamental concept of the SimCore architecture is its three-part composition, viz.: (i) the Core; (ii) the Modules; and, (iii) the Interface.

The core of the inventive architecture manages all data shared among the plural modules, including (i) Geometry, (ii) Communications, (iii) Sensor Fusion, and (iv) Decision-Making. The modules of the inventive architecture contain all the functionality required to model the mission areas of interest. The interface of the inventive architecture facilitates connecting the modules to the core and controls access to shared data.

The present invention features a "core-modular" architecture. In furtherance of universal navy mission modeling interoperability, the present invention's Navy mission modeling architecture employs "plug-and-play" functionality. Of particular note, exemplary inventive practice is attributed with plug-and-play expandability, suitable for complex analyses. By enabling straightforward communication between models, plug-and play functionality facilitates the use of models from different sources. To this end, the inventive interoperability architecture provides for a communication infrastructure.

According to exemplary practice of the inventive core-modular concept, the modules contain the mission modeling functionality, and the core contains the communication infrastructure. Further M&S development by Government and third parties can be streamlined by inventive practice. The present invention's core functionality can reduce time and effort for M&S development.

An exemplary embodiment of a SimCore architecture has a standardized interface, which promotes interoperability of the modules. The present invention's interface: ensures and verifies standard compliance for modules; permits mixing and matching of modules from third-party sources; provides interface to data shared among the modules; and, aids in configuration management of modules.

The core of the SimCore architecture: facilitates module development and validation, often at decreased costs; simplifies modernization of legacy codes; supports multiple modules simultaneously; improves performance of the interoperability architecture. The SimCore architecture's modules can be rapidly developed to support emerging analytical agendas, thereby addressing near-term mission areas.

FIG. 3 is illustrative of some naval applications of inventive practice. Many types of military modules may be suitable for association, via the interface, with the core of an inventive interoperability architecture, such modules including but not limited to the following: readiness; manpower; signatures; integrated air and missile defense (IAMD): military deception (MILDEC); electronic attack (EA, or ECM); anti-submarine warfare (ASW); anti-air warfare (AAW); mine warfare (MIW); electronic warfare (EW); surface warfare (SUW, or SW, or SuW); intelligence, surveillance, reconnaissance (ISR); contingency operations (CONOP); command and control (C2); hull, mechanical, and electrical (HM&E).

An important principle of the present invention is that communication between modules is necessary, but not sufficient, for universal interoperability of its interoperability architecture. The inventive core is responsible for maintaining the correctness of shared data. The data sharing of the present invention's core bears some similarity to the data sharing of the HLA's object model template.

In an HLA, the HLA object model template is the set of all data communicated between simulations in a federation. According to the HLA standard, this set of data varies from federation to federation. Federation coding must be customized to interface different models with middleware. Therefore, an HLA federate designed for one HLA federation will not necessarily be able to communicate with an HLA federate designed for an HLA federation having a different HLA object model template.

The interoperability of federates is reduced by this variability, from federation to federation, among the corresponding HLA object model templates. Further, the HLA tends to carry redundancies of common functionalities. In addition, the HLA's lack of code sharing implies a lack of code reuse. Moreover, the design costs, development times, and computer bugs characterizing the HLA are greater than desired.

In contrast to the HLA interoperability architecture, the present invention's interoperability architecture has a core containing a fixed set of shared data. The inventive core handles shared data in a manner somewhat akin to the manner in which an HLA object model template handles shared data. However, HLA object model templates may differ from one another in terms of the set of shared data that each HLA object model template contains.

In significant contradistinction to an HLA object model template, in an inventive core the set of shared data is fixed. That is, inventive cores are identical to one another in terms of the set of shared data that each inventive core contains. In exemplary inventive practice, the set of shared data contained by the core of any inventive interoperability architecture is categorized according to geometry, communications, sensor fusion, and decision-making.

In applications involving Navy missions, a major purpose of the SimCore architecture is to facilitate interoperability for all Navy mission modeling. The SimCore design accounts for all of the different missions that the Navy is required to perform to fulfill its duties. Some inventive embodiments provide for use of the United States Navy's Universal Naval Task List (UNTL) as the source of mission requirements. See Universal Naval Task List (UNTL), OPNAVINST 3500.38B/MCO3500.26A/USCG COMDTINST 3500.1B, Version 3.0, U.S. Navy, 30 Jan. 2007, incorporated herein by reference.

The UNTL can represent a rigorous tool for the requirements generation process, since the UNTL is the list established by the Navy to describe all of the tasks that the Navy can perform to fulfill its duties. Using the UNTL, the use cases for the SimCore architecture are generated. These use cases are then implemented to generate the Navy mission model requirements for SimCore. Finally, the mission model requirements are used to evaluate which mission modeling functionalities should be in the core, and which mission modeling functionalities should be in the modules.

Constructing the Architecture

In investigating their invention, the present inventors set out to set up an architecture that could be used to facilitate the modeling of all possible U.S. Navy missions. They used the UNTL as the source for their requirements. The UNTL states that its purpose is "No provide joint force, naval, and ground commanders with an interoperability tool for use in articulating their mission requirements."

The present inventors recognized that the UNTL would constitute a propitious resource of requirements for their interoperability architecture of Navy mission modeling. To the present inventors' knowledge, their application of the UNTL is unique to Navy modeling and simulation. The UNTL is a useful source of information, as it describes the tasks that the U.S. Navy performs to carry out its missions. However, the text of each task set forth in the UNTL is not sufficient as a source for software requirements. Therefore, the present inventors converted each of the UNTL tasks into a format known as a "use case."

Software engineers and systems engineers are familiar with use cases. A use case is a conventional technique for defining interactions that take place between an actor and a system in order to achieve a goal. For instance, a software developer may formulate a use case to identify and organize requirements that specify the intended behavior of a system. Often a use case includes preconditions and post-conditions. In a sense, a use case describes the possible scenarios pertaining to a particular goal.

Figure 5:
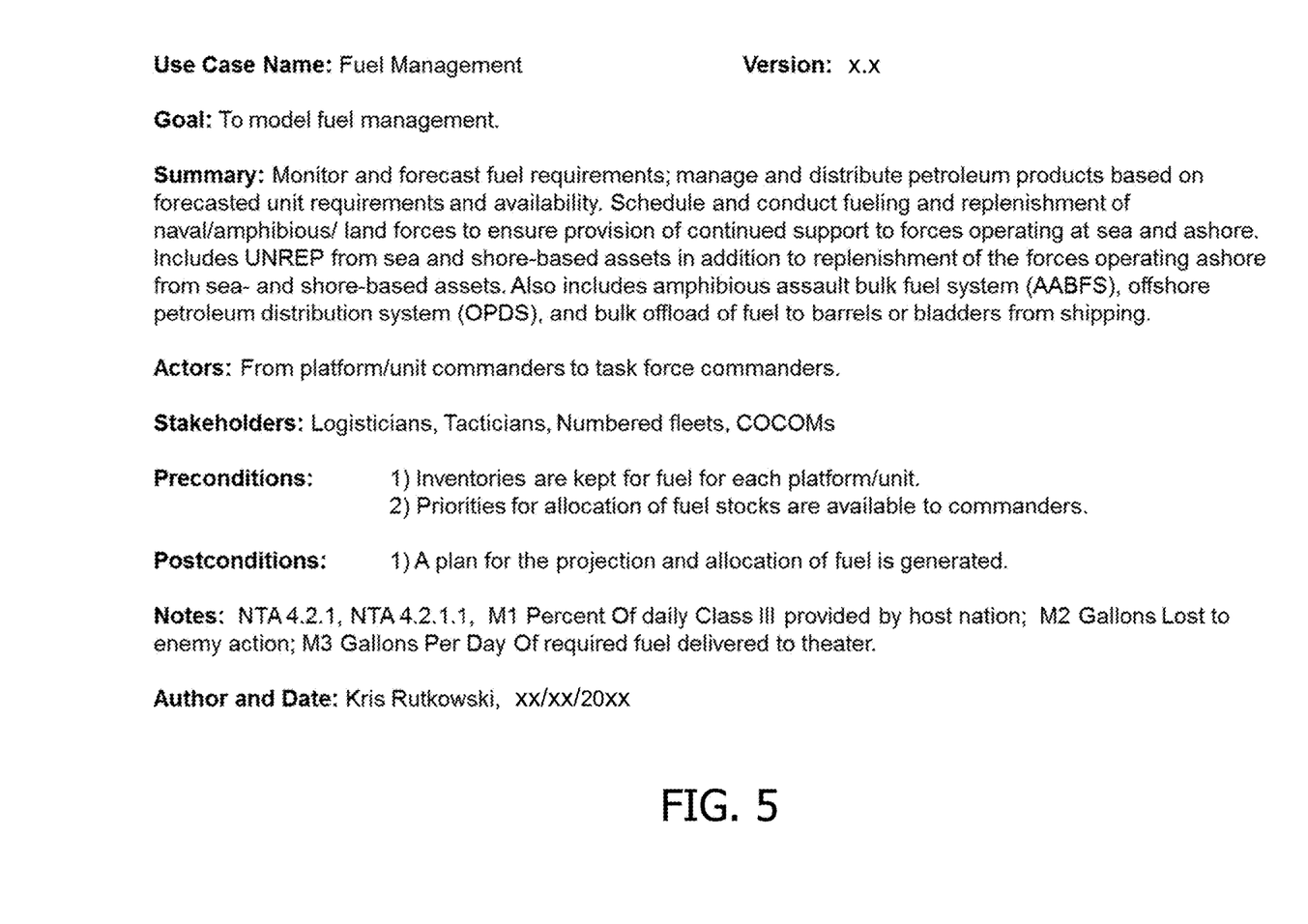
FIG. 5 is an example of a use case that was generated during the requirements generation process, in accordance with the present invention.

The use case depicted in FIG. 5, entitled "Fuel Management," is an example of a use case generated during a SimCore requirements generation process. Some UNTL text is modified to explicitly state the part of the Navy task to be modeled. Other information is added, such as goals, actors, conditions, stakeholders, etc. When the process of converting the UNTL to use cases was completed, the present inventors employed a traditional Waterfall model software design process. The Waterfall software development model is among a variety of software development models known in the art. In many such models, the initial phase is a requirements phase. A Waterfall model provides for a sequence of activities in a software development process; like a waterfall, progress flows downward through phases including requirements, design, implementation, verification, and maintenance.

Figure 6:
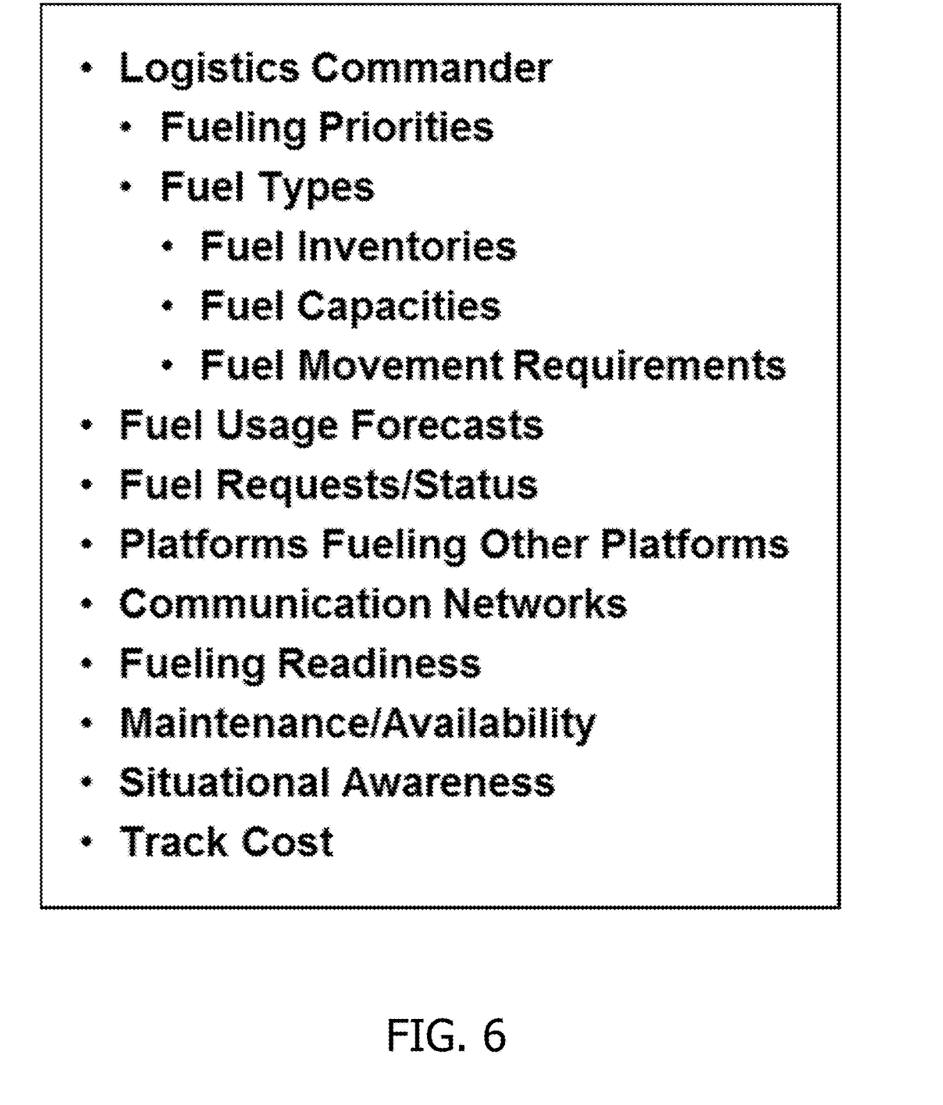
FIG. 6 depicts a listing of some requirements that were generated, in accordance with the present invention, based on the Fuel Management use case depicted in FIG. 5.

In the Waterfall model and many other conventional software design process models, the first phase of the model is "Requirements Generation." In the requirements generation phase, each use case was implemented by the present inventors to generate a list of requirements for a U.S. Navy simulation that could model that use case. An example of requirements that the present inventors generated in this manner is shown in FIG. 6. These are the fuel management requirements that they derived and developed from the use case shown in FIG. 5.

Next, the present inventors proceeded to perform the "Design" phase of the Waterfall model software design process. One of the primary aims of exemplary inventive practice is to determine what subset of mission-modeling functionality is to reside in the core. In the design phase, the present inventors used the requirements that they had generated to determine the functionalities that would reside in the core of their architecture, and the functionalities that would reside in one or more modules of their architecture. In deciding whether a particular functionality belonged in a module, or belonged in the core, the present inventors considered each module in terms of whether that module would need to use that functionality.

A functionality that is assigned to the core is referred to herein as a "core functionality." A functionality that is assigned to one or more modules is referred to herein as a "modular functionality." According to exemplary inventive practice, if it is determined that every mission model will need to use a given functionality, then that functionality is to be assigned as a core functionality. On the other hand, if it is determined that at least one mission model will not need to use a given functionality, then that functionality is assigned, as a modular functionality, to the mission model or models that do need to use that functionality.

An inventive practitioner's determination of whether a module "needs to use" a particular functionality may require a degree of judgment. In this disclosure, the term "use" contained in this context implies that a given module (i) needs to implement that functionality individually, and/or (ii) needs to implement that functionality jointly with (e.g., in addition to or in conjunction with) at least one other module.

In deciding whether to designate functionalities as core functionalities versus modular functionalities, the present inventors kept in mind two guidelines as to when it may be preferable to designate a certain type of functionality as a core functionality. Firstly, it is desirable that the inventive architecture provide for a high amount of code reuse. Any modeling functionality that will be shared by the modules should be placed in the core so that the functionality will not have to be redeveloped by the module developers. Secondly, it is desirable that the core be the gatekeeper of all data that can be shared by the modules, in order to maintain consistency of that shared data in the inventive architecture.

Figure 4:
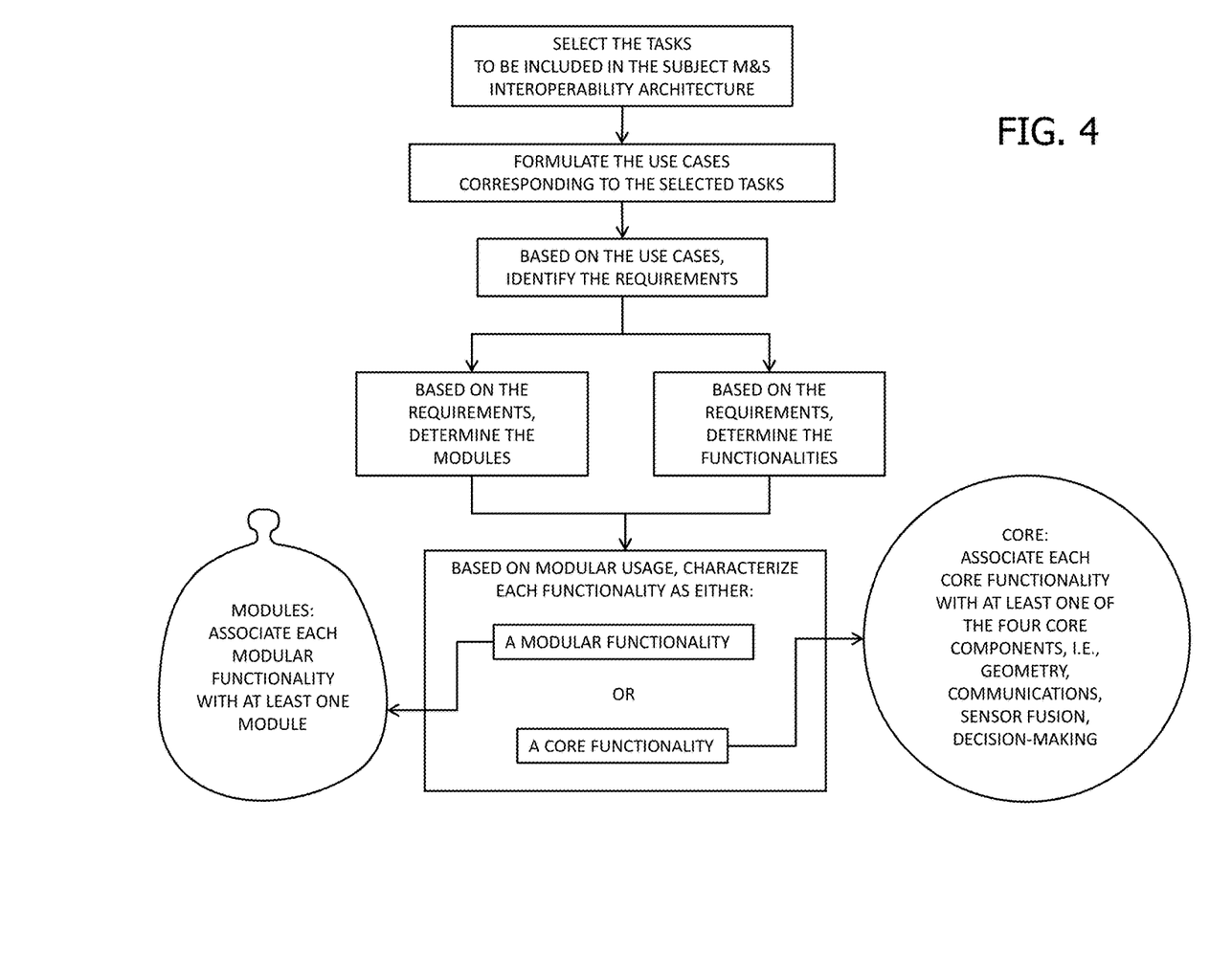
FIG. 4 is a flow diagram illustrating construction of interoperability architecture in accordance with exemplary practice of the present invention.

Accordingly, as illustrated in FIG. 4, the present inventors: selected tasks contained in the UNTL; formulated use cases, based on the tasks; established modules (each module constituting a mission model) and functionalities, based on the requirements; and, determined which functionalities are in the core and which functionalities are in the modules, based on the usage by the modules.

Note that, at the outset of their architectural construction process, the present inventors translated every task contained in the UNTL into a use case. They then selected the use cases that were germane to the subject architecture; this was tantamount to selecting the tasks that were germane to the subject architecture.

The present inventors' strategy in this regard was to create an interoperability architecture that can be utilized for practically any tasks that the Navy may perform. They thus composed a reference compendium of all use cases that the Navy would need to implement in practicing the inventive architecture. As an alternative approach, an inventive practitioner can transform tasks to use cases on an as-needed basis, that is, transform only those tasks that are germane to the subject architecture. The pertinent tasks can be devised and/or selected from a list, and then translated into use cases.

It is emphasized that an exemplary inventive architecture is, by its nature, adaptable to changing circumstances, e.g., changing mission requirements. The present inventor's implementation of the UNTL exemplifies how a foundation of a universal task list (such as the UNTL) can facilitate an ongoing adaptability of their interoperability architecture to any kind and number of changes within individual modules (models), as well as to incorporation (e.g., plugin) of any kind and number of additional modules (models). Modular plug-and-play capability is a major attribute of the present invention.

The four main portions of the core—i.e., the geometry component, the communications component, the sensor fusion component, and the decision-making component—are discussed in turn hereinbelow.

Geometry

The geometry of entities is controlled by the inventive architecture's core. Any naval mission simulation has to at least maintain a consistent picture of where all the entities exist within a scenario. For instance, the position of a destroyer in one module has to be the same position of that same destroyer in another module. The geometric design should provide for a high-performance, consistent view of the locations and movements of all entities. Hence, the geometry component of the inventive core provides a framework to handle all objects in a simulation that have a physical representation.

Among the primary inputs to the geometry modeling of the core are the parameters concerning the simulation environment. For example, modules can add a map to the simulation environment, and can also specify other environmental parameters such as sea state and wind. Entities are defined by the modules to represent anything that has a physical location and has the potential to move. The core maintains a list of modules that share or access each entity.

Modules can modify any parameters of the entities, such as the size of an entity, its velocity, acceleration, and bearing. The geometry component of the core also provides the ability to model systems where the performance of the system varies with respect to geometry. An example of this is a sensor that has a field of view and cannot detect anything outside of its field of view.

During the simulation, the geometry component performs the necessary calculations to determine the appropriate position, bearing, velocity, and acceleration of each entity at every moment in time. The geometry component determines when any systems have had the opportunity to interact with any entities. In addition, any collisions between entities are determined by the geometry component in this process.

Communications

Another basic constituent of the present invention is its ability to represent communication among systems and entities. The communication links are often a contended resource; the core must be the arbiter of that resource to maintain modeling correctness. In the process of maintaining the correctness of communication modeling, the communications component of the core also models the movement of messages along the different networks within the simulation. In this way, the core facilitates the modeling of a variety of communication technologies, organizations, topologies, protocols, and architectures.

The specifics of the communication networks are specified by the modules. Other inputs to the geometry component within the core include limitations on bandwidth, line latencies, and latencies of other key communication resources. The interface to the communication functionality allows for the construction of networks and for the sending/receiving of messages. The interface also includes a framework for the types of messages that can be communicated, and a method for specifying the desired recipients of each message.

Sensor Fusion

Inclusion of sensor fusion capability in the core makes practical sense in view of the fact that nearly all mission models contain some level of sensor fusion. In terms of function and purpose, the core's sensor fusion component affords shared data consistency.

For example, imagine a scenario in which a sensor is in a module, and the module resides on a ship. A different module has a military deception technique that can modify the output of that sensor. Without a core functionality that facilitates those interactions, it is not possible for the military deception technique to impact the results of the sensor. The sensor fusion in the core serves to enable that type of interaction. Accordingly, the interface for the sensor fusion functionality allows for the generation, modification, and transmission of fused sensor outputs.

The sensor fusion component of the core maintains a situational awareness state for everything in the modules that either generates or uses sensor data. This situational awareness state is updated every time step to account for new sensor data, and also to account for the staleness of old sensor data. Where appropriate, the sensor fusion functionality aggregates data from multiple sources and meld contacts, and tracks according to criteria fed from modules, including sensor errors and the confidence associated with individual sensors and tracking systems.

The sensor fusion component of the core also allows for the hierarchical organization of situational awareness data. With this design consideration in mind, the output of a single sensor fusion iteration must be in the same format as the input to a sensor fusion iteration.

Decision-Making

The present invention's interoperability architecture has a shared high-performance implementation of decision-making in the core; this makes practical sense from the standpoint that all mission models involve decision-making of some kind. In terms of function and purpose, the decision-making component in the core serves to maintain modeling data consistency.

Currently, all mission models have rules that are developed for their functional discipline; however, these rules tend to disregard other activities that the entity in the scenario may be performing concurrently. Often this modeling assumption is made because the modelers are unknowledgeable about the decision-making that is performed in areas outside of their functional discipline. The SimCore interoperability architecture thus requires that it be capable of handling situations in which there is a conflict between modules for the decision-making of an entity.

The decision-making component of the core provides for a framework for the specification of decision-making rules and their priorities, and resolution of these rules. The decision-making framework within the core has three parts, viz., (i) a Stimuli Repository, (ii) a Behavior Library, and (iii) an Algorithm Repository.

The decision-making framework's stimuli repository is a repository for all stimuli that could trigger the need for decision-making within the simulation. These stimuli are specified by the modules, and each stimulus is defined in terms of conditional triggers that may depend on sensor output, time schedules, preset warning levels, and other defined situations.

The decision-making framework's behavior library is a library of all rules and actions for behavior of all actors within the simulation. These rules and actions are also specified by the modules and are associated with one or more stimuli within the stimuli repository.

The decision-making framework's algorithm repository is a repository for the decision scoring algorithms for each decision that could be made any actor within a command hierarchy. These algorithms are specified by the modules and are composed of the required input data and calculation method.

As discussed hereinabove, the present invention's interoperability architecture is characterized by three primary elements (the core, the modules, and the interface), wherein the core is characterized by four primary elements (geometry, communication, sensor fusion, decision-making). The present invention's interoperability architecture is characterized, in addition, by functionality for resource arbitration.

Resource arbitration is essential to the present invention's core-modular architecture, because it represents a mechanism to ensure that no double-counting occurs in the utilization of shared resources. Resource arbitration remains in place and is constantly maintained through comparisons of resource requests to resource inventories. In support of this, a resource-naming standard is presented as part of the interface to make sure that resource double-counting will not occur due to inconsistent naming conventions.

Three-Phase Iterative Process of Operation

Figure 7:
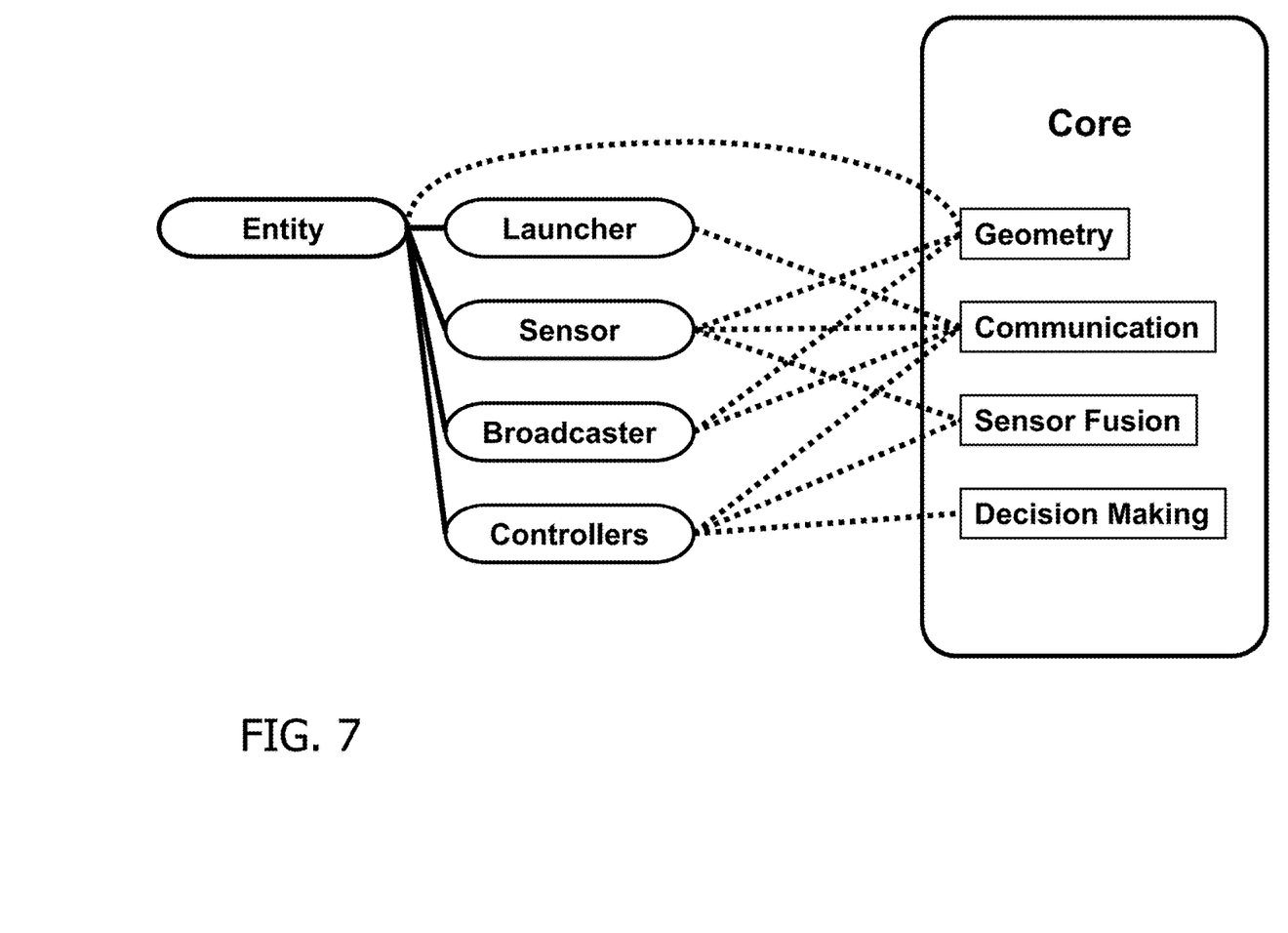
FIG. 7 is a diagram illustrating an example of a module characterized by various kinds of data, and the association of the data with the four main categories of data managed by the core of SimCore architecture in accordance with exemplary practice of the present invention, namely, (i) geometry, (ii) communications, (iii) sensor fusion, and (iv) decision-making.
Figure 8:
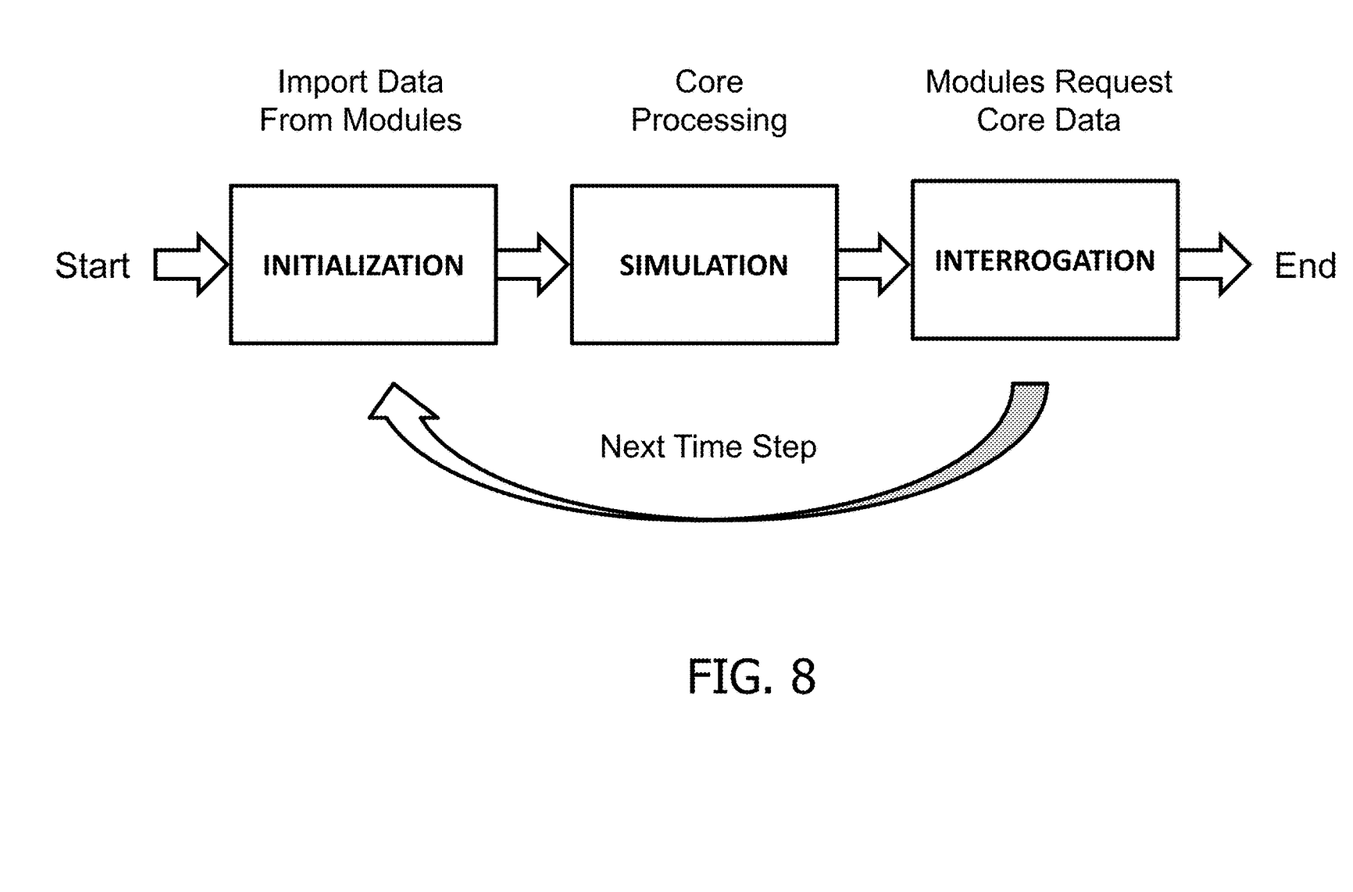
FIG. 8 is a diagram illustrating SimCore process flow in accordance with exemplary practice of the present invention.

The present invention's interoperability architecture, as usually embodied, is further characterized by an execution cycle. With reference to FIG. 8, the exemplary SimCore architecture presents three distinct execution phases, viz., (i) Initiation, (ii) Simulation, and (iii) Interrogation. According to the SimCore execution cycle, the execution is organized into these phases to ensure that all shared data exposed to the modules is consistent. FIG. 7 illustrates, by way of example, how a module's modular components can each communicate with one or more core components. All three execution phases occur in a three-phase cycle such as depicted in FIG. 8.

The initiation phase is the phase of the SimCore execution cycle in which modules have write-access to the shared data in the core. During this initiation phase, any module can add, delete, or modify any objects that are shared by that module. For example, it is during this phase that a module can delete an entity from the geometry component of the core, because the module has determined that the entity has been destroyed.

The simulation phase is the phase of the SimCore execution cycle in which the core performs all of the necessary calculations on the shared data. During the simulation phase, the modules can neither read nor write to any data that exists within the core. The principal reason for this restriction is to prevent access to data within the core that may be in the process of being modified by the internal core simulation, or that is otherwise in an undefined state. Numerous types of calculation may be performed during the simulation phase. For instance, the geometry component of the core can move an entity as defined by the entity's speed, direction, and acceleration, and the length of the time that the entity is supposed to travel.

The interrogation phase is the phase of the SimCore execution cycle in which modules have read-access to the shared data in the core. At the beginning of the interrogation phase, it is understood that modules and the core are synchronized to a specific simulation time. During this phase, the modules can access any data in the core, including data from other modules and the results of any calculations. Read access is limited to the interrogation phase because the shared data within the core is being modified by neither the modules nor the core. An example of an operation performed during this phase is an inquiry, from a module to the geometry component of the core, as to whether any collisions between entities have occurred.

The SimCore architecture offers many benefits for simulation developers. A major benefit is that the SimCore architecture promotes interoperability. Like federation architectures, SimCore promotes physical interoperability between simulations written in the architecture. Unlike federation architectures, the SimCore architecture also promotes functional interoperability. The present invention uniquely combines both types of interoperability (i.e., physical and functional), thereby allowing for the plug-and-play of multiple simulations/models with no new software development.

According to exemplary inventive practice, no software development is required when combining the modules; hence, the source codes of the modules can remain private. Therefore, the inventive interoperability architecture can support modules from both government and private industry sources without concerns for leakage of proprietary information such as source codes.

Another notable benefit of the SimCore architecture is that it promotes multiple types of reuse. According to the High Level Architecture (HLA), federations promote reuse at the simulation level. As distinguished from the HLA, the SimCore architecture promotes both simulation-level and code-level reuse. SimCore promotes simulation-level reuse through the plug-and-play capabilities of the architecture. SimCore promotes code-level reuse through the library-like functionality of the core.

As a result of its facilitation of simulation-level reuse and code-level reuse, the SimCore architecture may significantly decrease the start-up costs for the development of new simulations. Decrease in startup costs may ensue because much of the functionality needed for a new simulation (e.g., geometry, communication, sensor fusion, decision making) already exists within the core and will not have to be re-implemented. This benefit is not limited to simulations that do not yet exist, for there is also the potential to speed up the modernization of legacy simulations.

Also related to the SimCore architecture's simulation/ code-reuse benefit is the potential facilitation by the SimCore architecture of completion of new simulations. Generally speaking, a simulation should proceed through verification and validation (V&V) before the simulation is used for analysis; the V&V process is often a significant milestone in the delivery of the software. The SimCore architecture makes the V&V process easier for new simulation modules, because the core functionality need not be revalidated for each new simulation module.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A method for designing and executing an interoperability architecture for computer modeling, the method comprising:
    establishing tasks;
    formulating use cases corresponding to said tasks;
    based on said use cases, identifying requirements;
    based on said requirements, constructing an interoperability architecture characterized by both physical interoperability and functional interoperability, said interoperability architecture having a core, plural modules, and an interface between said core and said modules, each said module representing a different computer model, wherein said constructing of said interoperability architecture includes determining said modules, determining plural functionalities, and assigning each said functionality to either said core or each of at least one said module, wherein:
    said core contains a fixed set of shared data;
    said core includes at least four core components;
    a first said core component is a geometry component;
    a second said core component is a communications component;
    a third said core component is a sensor fusion component;
    a fourth said core component is a decision-making component;
    said fixed set of said shared data is categorized according to said geometry component, said communications component, said sensor fusion component, and said decision-making component; and
    effecting interoperability of said modules with respect to each other, said effecting of said interoperability including implementing a computer, wherein said interoperability includes a cyclical process having at least three phases, said at least three phases including an initiation phase, a simulation phase, and an interrogation phase, said cyclical process maintaining consistency of said shared data contained in said core, wherein:
    during said initiation phase, said modules have write-access, via said interface, to said shared data contained in said core, each said module being capable of adding to or deleting from or modifying said shared data contained in said core, said modules not having read-access to said shared data contained in said core;
    during said simulation phase, said core performs at least one calculation with respect to said shared data, said modules having neither write-access nor read-access to said shared data contained in said core;
    during said interrogation phase, said modules have read-access, via said interface, to said shared data contained in said core, each said module being capable of reading said shared data contained in said core, said modules not having write-access to said shared data contained in said core.

2. The method of claim 1, wherein:
    said assigning of each said functionality includes deciding whether said functionality belongs in said core or at least one said module;
    said deciding of whether said functionality belongs in said core or at least one said module includes considering whether every said module needs to use said functionality;

if every said module needs to use said functionality, then said functionality belongs in said core;

if at least one said module does not need to use said functionality, then said functionality belongs in each said module that does need to use said functionality.

3. The method of claim 1 wherein, if a said functionality is assigned to said core, then said constructing of said interoperability architecture includes designating said functionality for at least one said core component.

4. The method of claim 3, wherein:
said assigning of each said functionality includes deciding whether said functionality belongs in said core or at least one said module;
said deciding of whether said functionality belongs in said core or at least one said module includes considering whether every said module needs to use said functionality;
if every said module needs to use said functionality, then said functionality belongs in said core;
if at least one said module does not need to use said functionality, then said functionality belongs in each said module that does need to use said functionality.

5. An apparatus comprising a computer having computer code characterized by computer program logic for enabling said computer to effectuate an interoperability architecture for computer modeling, said computer code being executable by said computer so that, in accordance with said computer program logic, said computer performs acts including:
inputting data that defines functionalities of said architecture;
configuring said architecture characterized by both physical interoperability and functional interoperability, said interoperability architecture having a core, a plurality of modules, and an interface between said core and said modules, each said module representing a different computer modeling program, wherein:
said core contains a fixed set of shared data;
said core includes at least four core components;
a first said core component is a geometry component;
a second said core component is a communications component;
a third said core component is a sensor fusion component;
a fourth said core component is a decision-making component;
said fixed set of said shared data is categorized according to said geometry component, said communications component, said sensor fusion component, and said decision-making component;
assigning each said functionality to either said core or at least one said module, wherein said functionality is assigned to said core if every said module needs to use said functionality, and wherein said functionality is assigned to at least one said module if at least one said module does not need to use said functionality; and
maintaining interoperability of said architecture through an iterative cyclical process having at least three phases, said at least three phases including an initiation phase, a simulation phase, and an interrogation phase, said cyclical process maintaining consistency of said shared data contained in said core, wherein:
during said initiation phase, said modules have write-access, via said interface, to said shared data contained in said core, each said module being capable of adding to or deleting from or modifying said shared data contained in said core, said modules not having read-access to said shared data contained in said core;
during said simulation phase, said core performs at least one calculation with respect to said shared data, said modules having neither write-access nor read-access to said shared data contained in said core;
during said interrogation phase, said modules have read-access, via said interface, to said shared data contained in said core, each said module being capable of reading said shared data contained in said core, said modules not having write-access to said shared data contained in said core.

6. The apparatus of claim 5, wherein said functionalities derive from requirements that derive from use cases that derive from tasks, and wherein said computer performs operations further including inputting data that defines at least one of said requirements, said use cases, and said tasks.

7. The apparatus of claim 5, wherein said assigning of a said functionality to a core includes assigning said functionality to at least one said core component.

8. The apparatus of claim 7, wherein:
said functionalities derive from requirements that derive from use cases that derive from tasks;
said computer performs operations further including inputting data that defines at least one of said requirements, said use cases, and said tasks.

9. A non-transitory computer-readable storage medium comprising computer-executable computer code characterized by computer program logic for enabling a computer to effectuate an interoperability architecture for computer modeling, said computer code being executable by said computer so that, in accordance with said computer program logic, said computer performs acts including:
inputting data that defines functionalities of said architecture;
configuring said architecture characterized by both physical interoperability and functional interoperability, said interoperability architecture having a core, a plurality of modules, and an interface between said core and said modules, each said module representing a different computer modeling program, wherein:
said core contains a fixed set of shared data;
said core includes at least four core components;
a first said core component is a geometry component;
a second said core component is a communications component;
a third said core component is a sensor fusion component;
a fourth said core component is a decision-making component;
said fixed set of said shared data is categorized according to said geometry component, said communications component, said sensor fusion component, and said decision-making component;
assigning each said functionality to either said core or at least one said module, wherein said functionality is assigned to said core if every said module needs to use said functionality, and wherein said functionality is assigned to at least one said module if at least one said module does not need to use said functionality; and
maintaining interoperability of said architecture through an iterative cyclical process having at least three phases, said at least three phases including an initiation phase, a simulation phase, and an interrogation phase, said cyclical process maintaining consistency of said shared data contained in said core, wherein:
during said initiation phase, said modules have write-access, via said interface, to said shared data contained in said core, each said module being capable of adding to or deleting from or modifying said shared data contained in said core, said modules not having read-access to said shared data contained in said core;

during said simulation phase, said core performs at least one calculation with respect to said shared data, said modules having neither write-access nor read-access to said shared data contained in said core;

during said interrogation phase, said modules have read-access, via said interface, to said shared data contained in said core, each said module being capable of reading said shared data contained in said core, said modules not having write-access to said shared data contained in said core.

10. The non-transitory computer-readable storage medium of claim 9, wherein said functionalities derive from requirements that derive from use cases that derive from tasks, and wherein said computer performs operations further including inputting data that defines at least one of said requirements, said use cases, and said tasks.

11. The non-transitory computer-readable storage medium of claim 9, wherein said assigning of a said functionality to a core includes assigning said functionality to at least one said core component.

12. The non-transitory computer-readable storage medium of claim 11, wherein:

said functionalities derive from requirements that derive from use cases that derive from tasks;

said computer performs operations further including inputting data that defines at least one of said requirements, said use cases, and said tasks.

* * * * *